United States Patent [19]
Tolmie, Jr.

[11] Patent Number: 5,029,304
[45] Date of Patent: Jul. 2, 1991

[54] SENSOR WITH ABSOLUTE DIGITAL OUTPUT UTILIZING HALL EFFECT DEVICES

[75] Inventor: Robert J. Tolmie, Jr., Brookfield, Conn.

[73] Assignee: Pitney Bowes Inc., Stamford, Conn.

[21] Appl. No.: 607,781

[22] Filed: Oct. 31, 1990

Related U.S. Application Data

[63] Continuation of Ser. No. 291,094, Dec. 28, 1988, abandoned.

[51] Int. Cl.$^5$ .............................................. H03M 1/22
[52] U.S. Cl. ........................................ 341/15; 341/10; 324/207.2
[58] Field of Search .................... 341/9, 10, 11, 13, 15, 341/96, 116, 171; 250/231 SE, 231.18; 324/117 H, 203.2, 229; 377/34

[56] References Cited

U.S. PATENT DOCUMENTS

| 3,768,094 | 10/1973 | Henrich | 340/347 P |
| 4,014,015 | 3/1977 | Gundlach | 341/15 |
| 4,171,130 | 10/1979 | Jeschke et al. | 271/10 |
| 4,210,936 | 7/1980 | Cinque et al. | 358/283 |
| 4,361,835 | 10/1982 | Nagy | 340/624 |
| 4,518,913 | 5/1985 | Avery | 324/208 |
| 4,559,452 | 12/1985 | Igaki et al. | 250/560 |
| 4,567,467 | 1/1986 | Wiblin et al. | 341/13 |
| 4,581,993 | 4/1986 | Schöneberger | 101/217 |
| 4,599,561 | 7/1986 | Takahashi et al. | 324/208 |
| 4,612,502 | 9/1986 | Alfons Spies | 324/208 |
| 4,633,224 | 12/1986 | Gipp et al. | 341/13 |
| 4,654,590 | 3/1987 | Kitaura et al. | 324/208 |
| 4,671,502 | 6/1987 | Sherman, III et al. | 271/4 |
| 4,691,912 | 9/1987 | Gillmann | 271/10 |
| 4,774,464 | 9/1988 | Kubota et al. | 341/15 |
| 4,953,842 | 9/1990 | Tolmie et al. | 217/2 |

Primary Examiner—A. D. Pellinen
Assistant Examiner—Brian K. Young
Attorney, Agent, or Firm—Charles G. Parks, Jr.; David E. Pitchenik; Melvin J. Scolnick

[57] ABSTRACT

A sensor for determining position or dimensions of an object comprises an array of detectors and an actuating medium of the detectors configured to cause the detectors to output an absolute Gray binary code.

6 Claims, 9 Drawing Sheets

FIG. 2

| POSITION | RANGE IN INCHES | DETECTOR NUMBER 10 11 12 13 14 15 16  BINARY OUTPUT | HEX OUTPUT |
|---|---|---|---|
| 0  | 0 - .050 | 0 0 0 1 1 1 1 | 0 F |
| 1  | .05- .1  | 0 1 0 1 1 1 1 | 2 F |
| 2  | .1 - .15 | 1 1 0 1 1 1 1 | 6 F |
| 3  | .25- .2  | 1 0 0 1 1 1 1 | 4 F |
| 4  | .2 - .25 | 1 0 0 0 1 1 1 | 4 7 |
| 5  | .25- .3  | 1 0 1 0 1 1 1 | 5 7 |
| 6  | .3 - .35 | 1 1 1 0 1 1 1 | 7 7 |
| 7  | .35- .4  | 1 1 0 0 1 1 1 | 6 7 |
| 8  | .4 - .45 | 1 1 0 0 0 1 1 | 6 3 |
| 9  | .45- .5  | 1 1 0 1 0 1 1 | 6 B |
| 10 | .5 - .55 | 1 1 1 1 0 1 1 | 7 B |
| 11 | .55- .6  | 1 1 1 0 0 1 1 | 7 3 |
| 12 | .6 - .65 | 1 1 1 0 0 0 1 | 7 1 |
| 13 | .65- .7  | 1 1 1 0 1 0 1 | 7 5 |
| 14 | .7 - .75 | 1 1 1 1 1 0 1 | 7 D |
| 15 | .75- .8  | 1 1 1 1 0 0 1 | 7 9 |
| 16 | .8 - .85 | 1 1 1 1 0 0 0 | 7 8 |
| 17 | .85- .9  | 1 1 1 1 0 1 0 | 7 A |
| 18 | .9 - .95 | 1 1 1 1 1 1 0 | 7 E |
| 19 | .95-1.0  | 1 1 1 1 1 0 0 | 7 C |
|    |          | MSB         LSB |   |

FIG. 4.

| POSITION | DETECTOR NUMBER 30 31 32 33 34 35 36 37 38 39 40 41 | HEX OUTPUT |
|---|---|---|
| 0 | 0 0 0 1 1 1 1 1 1 1 1 1<br>0 1 0 1 1 1 1 1 1 1 1 1<br>1 1 0 1 1 1 1 1 1 1 1 1<br>1 0 0 1 1 1 1 1 1 1 1 1 | 1FF<br>5FF<br>DFF<br>9FF |
| 1 | 1 0 0 0 1 1 1 1 1 1 1 1<br>1 0 1 0 1 1 1 1 1 1 1 1<br>1 1 1 0 1 1 1 1 1 1 1 1<br>1 1 0 0 1 1 1 1 1 1 1 1 | 8FF<br>AFF<br>EFF<br>CFF |
| 2 | 1 1 0 0 0 1 1 1 1 1 1 1<br>1 1 0 1 0 1 1 1 1 1 1 1<br>1 1 1 1 0 1 1 1 1 1 1 1<br>1 1 1 0 0 1 1 1 1 1 1 1 | C7F<br>D7F<br>F7F<br>E7F |
| 3 | 1 1 1 0 0 0 1 1 1 1 1 1<br>1 1 1 0 1 0 1 1 1 1 1 1<br>1 1 1 1 1 0 1 1 1 1 1 1<br>1 1 1 1 0 0 1 1 1 1 1 1 | E3F<br>EBF<br>FBF<br>F3F |
| 4 | 1 1 1 1 0 0 0 1 1 1 1 1<br>1 1 1 1 0 1 0 1 1 1 1 1<br>1 1 1 1 1 1 0 1 1 1 1 1<br>1 1 1 1 1 0 0 1 1 1 1 1 | F1F<br>F5F<br>FDF<br>F9F |
| 5 | 1 1 1 1 1 0 0 0 1 1 1 1<br>1 1 1 1 1 0 1 0 1 1 1 1<br>1 1 1 1 1 1 1 0 1 1 1 1<br>1 1 1 1 1 1 0 0 1 1 1 1 | F8F<br>FAF<br>FEF<br>FCF |
| 6 | 1 1 1 1 1 1 0 0 0 1 1 1<br>1 1 1 1 1 1 0 1 0 1 1 1<br>1 1 1 1 1 1 1 1 0 1 1 1<br>1 1 1 1 1 1 1 0 0 1 1 1 | FC7<br>FD7<br>FF7<br>FE7 |
| 7 | 1 1 1 1 1 1 1 0 0 0 1 1<br>1 1 1 1 1 1 1 0 1 0 1 1<br>1 1 1 1 1 1 1 1 1 0 1 1<br>1 1 1 1 1 1 1 1 0 0 1 1 | FE3<br>FEB<br>FFB<br>FF3 |
| 8 | 1 1 1 1 1 1 1 1 0 0 0 1<br>1 1 1 1 1 1 1 1 0 1 0 1<br>1 1 1 1 1 1 1 1 1 1 0 1<br>1 1 1 1 1 1 1 1 1 0 0 1 | FF1<br>FF5<br>FFD<br>FF9 |

FIG. 7

| POSITION | DETECTOR NUMBER 5 5 5 5 5 0 1 2 3 4 | HEX OUTPUT |
|---|---|---|
| .0 | 0 0 0 1 1 | 03 |
| .25 | 0 1 0 1 1 | 0B |
| .50 | 1 1 0 1 1 | 1B |
| .75 | 1 0 0 1 1 | 13 |
| 1.0 | 1 0 0 0 1 | 11 |
| 1.25 | 1 0 1 0 1 | 15 |
| 1.50 | 1 1 1 0 1 | 1D |
| 1.75 | 1 1 0 0 1 | 19 |
| 2.00 | 1 1 0 0 0 | 18 |
| 2.25 | 1 1 0 1 0 | 1A |
| 2.50 | 1 1 1 1 0 | 1E |
| 2.75 | 1 1 1 0 0 | 1C |
| 3.00 | 0 1 1 0 0 | 0C |
| 3.25 | 0 1 1 0 1 | 0D |
| 3.50 | 0 1 1 1 1 | 0F |
| 3.75 | 0 1 1 1 0 | 0E |
| 4.00 | 0 0 1 1 0 | 06 |
| 4.25 | 1 0 1 1 0 | 16 |
| 4.50 | 1 0 1 1 1 | 17 |
| 4.75 | 0 0 1 1 1 | 07 |

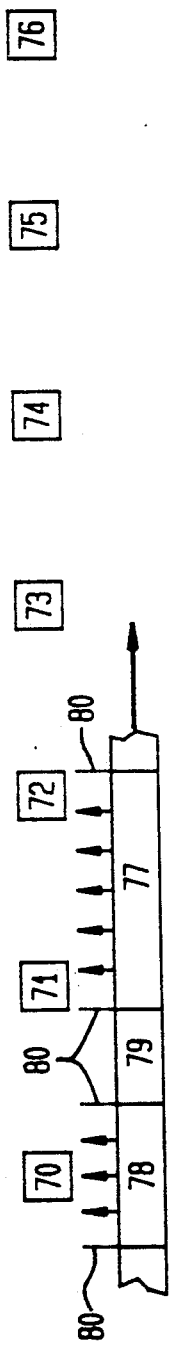
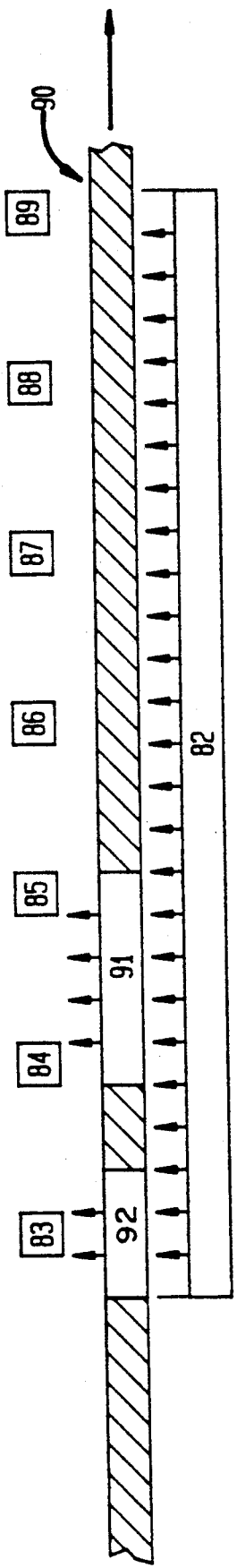
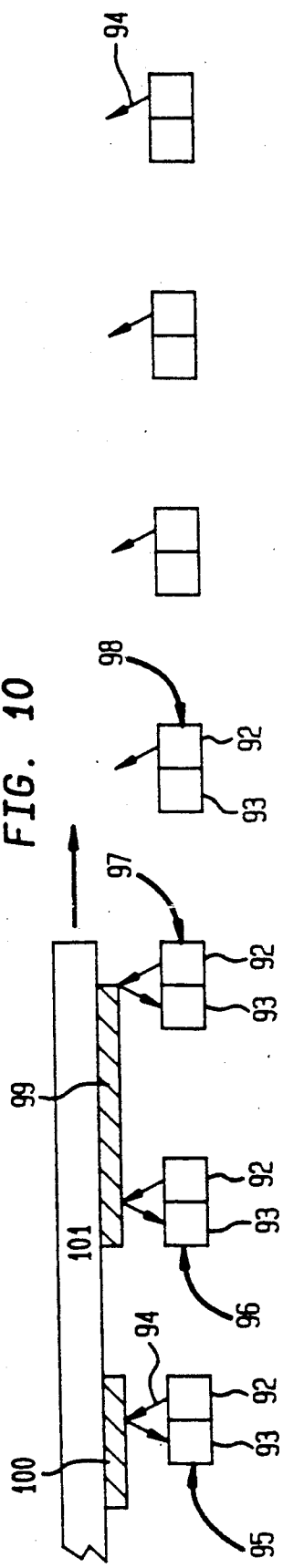
FIG. 8
FIG. 9
FIG. 10

FIG. 13

| DETECTOR NUMBER | | | | | | | HEX OUTPUT OF DETECTORS 132...136 | | HEX OUTPUT OF DETECTORS 139-140 |
|---|---|---|---|---|---|---|---|---|---|
| 132 | 133 | 134 | 135 | 136 | 139 | 140 | | | |
| 0 | 0 | 0 | 1 | 1 | 0 | 0 | 0 | 3 | 0 |
| 0 | 1 | 0 | 1 | 1 | 0 | 0 | 0 | B | 0 |
| 1 | 1 | 0 | 1 | 1 | 0 | 0 | 1 | B | 0 |
| 1 | 0 | 0 | 1 | 1 | 0 | 0 | 1 | 3 | 0 |
| 1 | 0 | 0 | 0 | 1 | 0 | 0 | 1 | 1 | 0 |
| 1 | 0 | 1 | 0 | 1 | 0 | 0 | 1 | 5 | 0 |
| 1 | 1 | 1 | 0 | 1 | 0 | 0 | 1 | D | 0 |
| 1 | 1 | 0 | 0 | 1 | 0 | 0 | 1 | 9 | 0 |
| 1 | 1 | 0 | 0 | 0 | 0 | 0 | 1 | 8 | 0 |
| 1 | 1 | 0 | 1 | 0 | 0 | 0 | 1 | A | 0 |
| 1 | 1 | 1 | 1 | 0 | 0 | 1 | 1 | E | 1 |
| 1 | 1 | 1 | 0 | 0 | 0 | 1 | 1 | C | 1 |
| 0 | 1 | 1 | 0 | 0 | 0 | 1 | 0 | C | 1 |
| 0 | 1 | 1 | 0 | 1 | 0 | 1 | 0 | D | 1 |
| 0 | 1 | 1 | 1 | 1 | 0 | 1 | 0 | F | 1 |
| 0 | 1 | 1 | 1 | 0 | 0 | 1 | 0 | E | 1 |
| 0 | 0 | 1 | 1 | 0 | 0 | 1 | 0 | 6 | 1 |
| 1 | 0 | 1 | 1 | 0 | 0 | 1 | 1 | 6 | 1 |
| 1 | 0 | 1 | 1 | 1 | 0 | 1 | 1 | 7 | 1 |
| 0 | 0 | 1 | 1 | 1 | 0 | 1 | 0 | 7 | 1 |
| 0 | 0 | 0 | 1 | 1 | 1 | 1 | 0 | 3 | 3 |
| 0 | 1 | 0 | 1 | 1 | 1 | 1 | 0 | B | 3 |
| 1 | 1 | 0 | 1 | 1 | 1 | 1 | 1 | B | 3 |
| 1 | 0 | 0 | 1 | 1 | 1 | 1 | 1 | 3 | 3 |
| 1 | 0 | 0 | 0 | 1 | 1 | 1 | 1 | 1 | 3 |
| 1 | 0 | 1 | 0 | 1 | 1 | 1 | 1 | 5 | 3 |
| 1 | 1 | 1 | 0 | 1 | 1 | 1 | 1 | D | 3 |
| 1 | 1 | 0 | 0 | 1 | 1 | 1 | 1 | 9 | 3 |
| 1 | 1 | 0 | 0 | 0 | 1 | 1 | 1 | 8 | 3 |
| 1 | 1 | 0 | 1 | 0 | 1 | 1 | 1 | A | 3 |
| 1 | 1 | 1 | 1 | 0 | 1 | 0 | 1 | E | 3 |
| 1 | 1 | 1 | 0 | 0 | 1 | 0 | 1 | C | 2 |
| 0 | 1 | 1 | 0 | 0 | 1 | 0 | 0 | C | 2 |
| 0 | 1 | 1 | 0 | 1 | 1 | 0 | 0 | D | 2 |
| 0 | 1 | 1 | 1 | 1 | 1 | 0 | 0 | F | 2 |
| 0 | 1 | 1 | 1 | 0 | 1 | 0 | 0 | E | 2 |
| 0 | 0 | 1 | 1 | 0 | 1 | 0 | 0 | 6 | 2 |
| 1 | 0 | 1 | 1 | 0 | 1 | 0 | 1 | 6 | 2 |
| 1 | 0 | 1 | 1 | 1 | 1 | 0 | 1 | 7 | 2 |
| 0 | 0 | 1 | 1 | 1 | 1 | 0 | 0 | 7 | 2 |

SENSOR WITH ABSOLUTE DIGITAL OUTPUT UTILIZING HALL EFFECT DEVICES

This application is a continuation of application Ser. No. 291,094, filed Dec. 28, 1988, now abandoned.

This invention relates to sensors producing digital outputs, and in particular to sensors that can sense multi-valued positions or dimensions of a stationary or moving object and output a digital signal that is an indication of the sensed parameter.

BACKGROUND OF THE INVENTION

Sensors for multi-valued parameters are known. A typical sensor could, for example, output an analog voltage or current signal whose value changes continuously with the value of the sensed parameter. For digital processing of that signal, the analog signal is typically converted by a known A/D converter to its digital code. When digital outputs are obtained in this manner, each discrete output is unique and thus an absolute indicator of the sensed value. By "absolute" is meant that no two outputs are the same over the desired range, so that each output unambiguously identifies a particular analog value or particular range of analog values.

To minimize errors in decoding sensed outputs it is also known to choose Gray coded digital outputs. The Gray code differs from other encoding schemes in that successive coded characters never differ in more than one bit. For example, in a shaft position encoder that outputs a digital signal to indicate which of the segments the shaft is in, when the shaft moves from segments seven to segment eight, the code must change from that for seven to that for eight As the shaft moves across the segment boundary, if more than one bit has to change, it is possible due to slight mechanical inaccuracies that not all bits will change at exactly the same time. If for example the most significant bit in a BCD code changed before any of the other bits changed, a very large error would result. With the Gray encoding scheme, since only one bit is allowed to change at a time, the error is minimized. Also, ambiguity is reduced when the shaft position is in the line that separates any two segments.

It is also desirable to eliminate the A/D converter, an expensive component, and construct a sensor with plural detectors to directly output the digital signal. To the best of by knowledge, no digital-signal-outputting sensor is known that produces a Gray coded output, such less one that is absolute, that is, without repetition of the coded outputs over the operating range of the sensor. Nevertheless, even without the absolute quality, such sensors can be used to obtain absolute information by recording and/or tracking the sequence of outputs to unambiguously distinguish between two outputs of the name code. This requires additional electronics, which is costly and consumes space.

BRIEF SUMMARY OF INVENTION

One object of the invention is a sensor that directly outputs a Gray encoded signal.

Another object of the invention is a sensor that directly outputs an absolute Gray encoded signal.

Still a further object of the invention is a sensor operating with magnetic fields that directly outputs an absolute Gray encoded signal.

These and further objects and advantages of the invention are achieved, briefly speaking, with a novel sensor comprising an array of spaced detectors cooperating with a detector-actuating medium configured such that relative motion of the array and medium produces over a given range a sequence of outputs that are Gray encoded.

In accordance with a further aspect of the invention, the configuration of detectors and actuating medium is such as to directly output absolute Gray encoded signals.

In a preferred embodiment, the detectors are linearly spaced such that their centerlines are spaced by a distance of $4 X\alpha$, where $\alpha$ is the resolution accuracy desired. The actuating medium includes at least three segments alternately capable of actuating and deactuating each detector, with the length of the segments in the array direction being in the ratio of 5:2:3.

In accordance with still another aspect of the invention, the detectors are magnetic detectors, and the actuating medium is a magnet having at least three pole segments differing in length.

BRIEF DESCRIPTION OF DRAWINGS

The invention will now be described in greater detail with reference to the accompanying drawings wherein:

FIG. 2 is a table showing the sensor outputs for various actuating medium positions;

FIG. 4 is a table showing the sensor outputs as a function of actuating medium position for the embodiment of FIG. 3;

FIG. 7 is a table showing the outputs for the embodiment of FIG. 5;

FIGS. 8, 9 and 10 are schematic views of three additional embodiments using optics in the sensor;

FIG. 13 is a table showing the sensor outputs as a function of actuating medium position for the embodiment of FIG. 12.

DETAILED DESCRIPTION OF PREFERRED EMBODIMENTS

Figure 1:
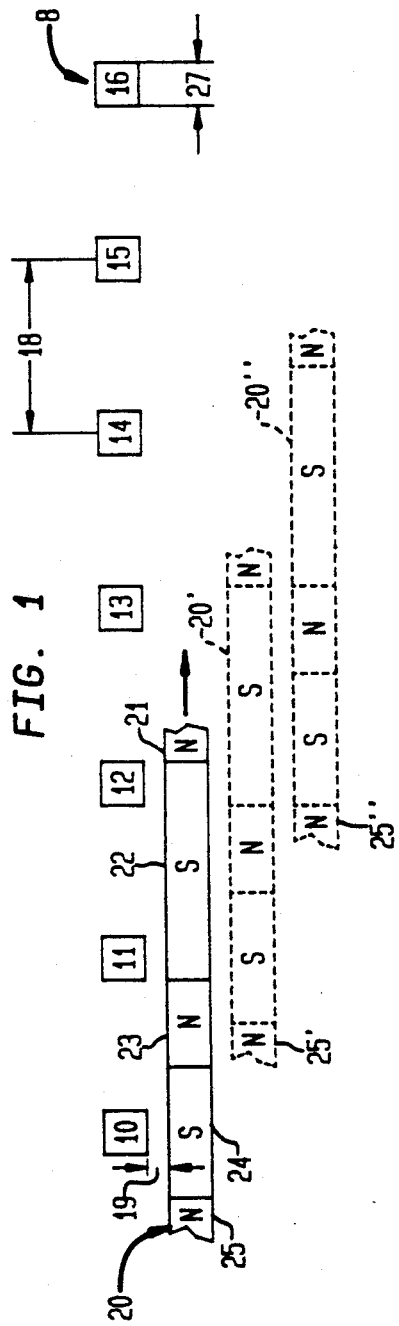
FIG. 1 schematically illustrates one sensor embodiment using magnets in accordance with the invention.

FIG. 1 illustrates one sensor embodiment in accordance with the invention that will directly output an absolute Gray-encoded signal. An array 8 of seven discrete detectors is provided. The detectors are arranged in a row and referenced 10-16. Each is schematically shown as a rectangle, representing the active detecting area of the detector. The detectors are equally spaced, with a centerline spacing indicated by 18. The detectors can, for example, be magnetic detectors of the Hall-Effect type commercially available as inexpensive discrete electrical components from many supply houses.

The magnetic field to actuate the detectors is an elongated permanent magnet 20 divided into plural segments referenced 21-25 and spaced a short distance or gap 19 from the detector array. The magnet position referenced 20 is the zero or start position. For this explanation, the array 8 is fixed and it is assumed that the magnet 20 is movable to the right in a line parallel to the array 8 in response to some sensed parameter. Shown in dashed lines is the relative vertical position for its fourth 20' and ninth 20" positions when moved by the sensed parameter. For clarity's sake, they are shown offset, but actually would be in line with the first position. In a practical embodiment with the detector array fixed, the magnet would be coupled to a suitable mechanism that causes it to move to the right to sense, for example, a dimension of an object.

Each detector responds to the presence or absence of a specific magnetic field. In the case illustrated, the detectors are constructed to output a logic "1" when no field is present or when it detects the field from a North (N) pole, and to output a logic "0" when it detects the field from a South (S) pole. The outputs from the seven detectors represent an absolute Gray code when there is a specific relationship between the detector spacing and the pole lengths of the magnet. In the arrangement shown in FIG. 1, which is drawn to scale, the active area of each detector, indicated by reference numeral 27, is one unit long, the detector centerlines spacing 18 is four units long, the leading S pole segment 22 is five units long, the adjacent trailing N pole segment 23 is two units long, and the trailing S pole segment 24 is three units long. Since the detectors produce "1" when detecting no field or a N pole field, the end N pole segments 21 and 25 can be omitted, but it is preferred to include them because it sharpens the transition between segments, focuses the magnetic field more at the detectors as is wanted, and reduces stray and fringing fields. The length of the end N pole segments is not important, which is why they are shown with broken lines at their ends. It is important to note, and a feature of the invention, with a one-unit active area detector, centerline spacings between detectors of four units, the active pole segments 22–24 starting from the leading segment 22 have lengths in the ratio of 5:2:3 units.

In the start or zero position shown in solid lines in FIG. 1, detectors 10, 11 and 12, facing S poles, output a "0", and the remaining detectors facing no pole or a N pole output a "1". Treating detector 10 as outputting the most significant bit (MSB) and detector 16 as outputting the least significant bit (LSB), the detector output for the zero position of the magnet 20 in BCD is 0001111, which in Hexadecimal notation (Hex) is OF. By the same reasoning, when the magnet is in the fourth position 20', positioned four units to the right, the output is 1000111=47(Hex), and when the magnet is in the ninth position 20", positioned nine units to the right of the start position, the output is 1101011=6B(Hex). The table in FIG. 2 shows the outputs in binary and in Hex for each of the magnet 20 positions of which there are a total of twenty. It should be noted from a comparison of the binary outputs that Gray encoding exists, because never for the twenty unit range shown is there more than a one-bit change in the binary output between adjacent magnet positions. Moreover, the equivalent Hex output column demonstrates that an absolute code has been created because no two outputs are alike.

In a specific example with FIG. 1 geometry, one unit equalling 0.05 inch, the detector spacing was 4×0.05=0.2 inch, and the magnet lengths 22, 23, 24 were, respectively, 0.25, 0.1 and 0.15 inch long. In this case, as previously noted, the resolution ($\alpha$) desired was 0.05 inch—thus the detector spacing of 4×$\alpha$. In the second column in the FIG. 2 table are listed the sub-range of movements for each magnet position to produce the output indicated for that row. Thus, the system illustrated in FIG. 1 will measure twenty positions each with a resolution of 0.05 inch over a range of 0–1.0 inch.

The invention is not limited to a seven detector array employing a magnet with the three segments depicted in FIG. 1 to produce absolute Gray encoded outputs. The design rules to follow to select other arrangements are as follows:

1. Resolution will be±one-quarter of the center distance between detectors.

2. The magnet will have its poles configured so that the detector's output changes each time the magnet moves a distance equal to one-quarter of the detector spacing.

3. The magnet just have at least one pole segment that bridges two detectors—in the FIG. 1 arrangement, segment 22 being five units long bridges two detectors spaced four units apart.

4. Because of the one-quarter center pitch, the pole pattern in the magnet is chosen such that the bit output sequence at the first detector will be repeated at every center distance at the next successive detector. For example, in the FIG. 2 table, note that the output of detector 10 for magnet positions 0–3 is 0011, which is the same output sequence at detector 11 for magnet positions 4–7, which is the same sequence from detector 12 for magnet positions 8–11, and so on. There are four possible magnet positions for each detector center spacing. This behavior is characteristic of constructions according to the invention.

Figure 3:
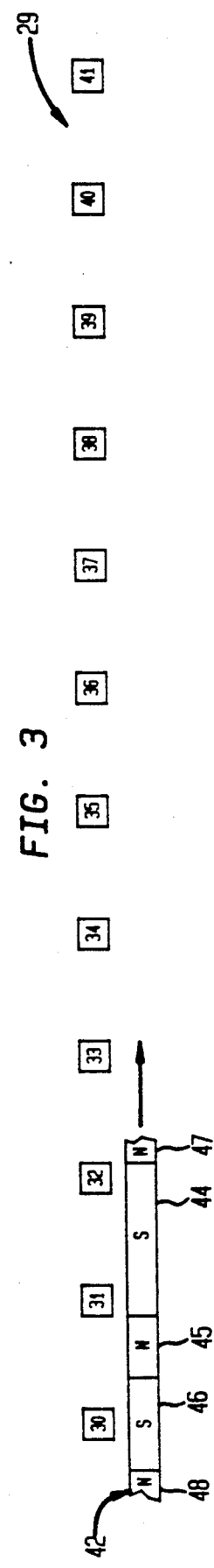
FIG. 3 is a view similar to FIG. 1 of a second embodiment using magnets in accordance with the invention.

Other examples of sensors according to the invention are described below. FIG. 3 shows part of a detector array 29 comprising twelve detectors 30–41. The magnet configuration 42 comprises the same three segment arrangement 44–46 with reversing poles 47, 48 at either end to increase cut-off sharpness. In this case, the effective magnet length of segments 44–46 is ten fourths of the detector centerline spacing, in the same 5:2:3 ratio previously described. This arrangement with twelve detectors will produce forty absolute Gray encoded positions, the output sequence of which, in BCD and Hex, is listed in the table of FIG. 4 for the first thirty-six positions. The first column on the left in FIG. 4 uses position notation covering four positions each, so that the shifting sequence of BCD outputs for each position designated in the left column is made more apparent.

Figure 5:
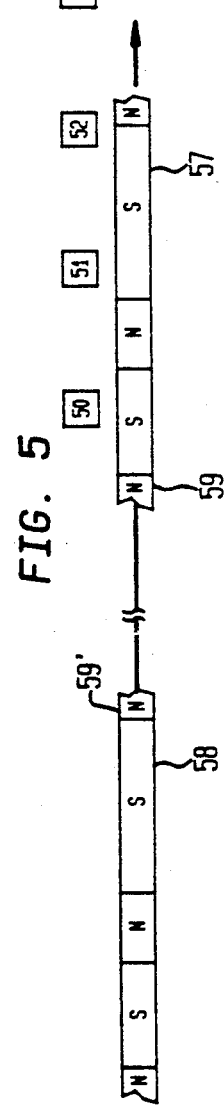
FIG. 5 is a view similar to FIG. 1 of a third embodiment using magnets.

The invention is not limited to the use of a single actuating medium. FIG. 5. shows an arrangement comprising five detectors which with two actuators also produces twenty absolute Gray encoded positions. In this embodiment, the detectors are referenced 50–54, and the actuators are a first magnet 57 with the 5:2:3 ratio of segment lengths coupled to a second magnet 58 with the 5:2:3 ratio of segment lengths displaced eleven units from the first magnet. Both magnets move in unison to the right in response to the sensed parameter. The output pattern for the arrangement is displayed in the table of FIG. 7. Alternatively, the two magnets can be combined into a single magnet, with the connecting piece being a single N pole interconnecting the trailing reversing N pole 59 of the first magnet and the leading reversing N pole 59' of the second magnet.

The total length of this connecting magnet is ten times the detector resolution giving a pattern that would be 5:2:3:10:5:2:3. This pattern can be repeated for what ever number of times required by extending the total length of the magnet or adding more magnets.

Figure 6:
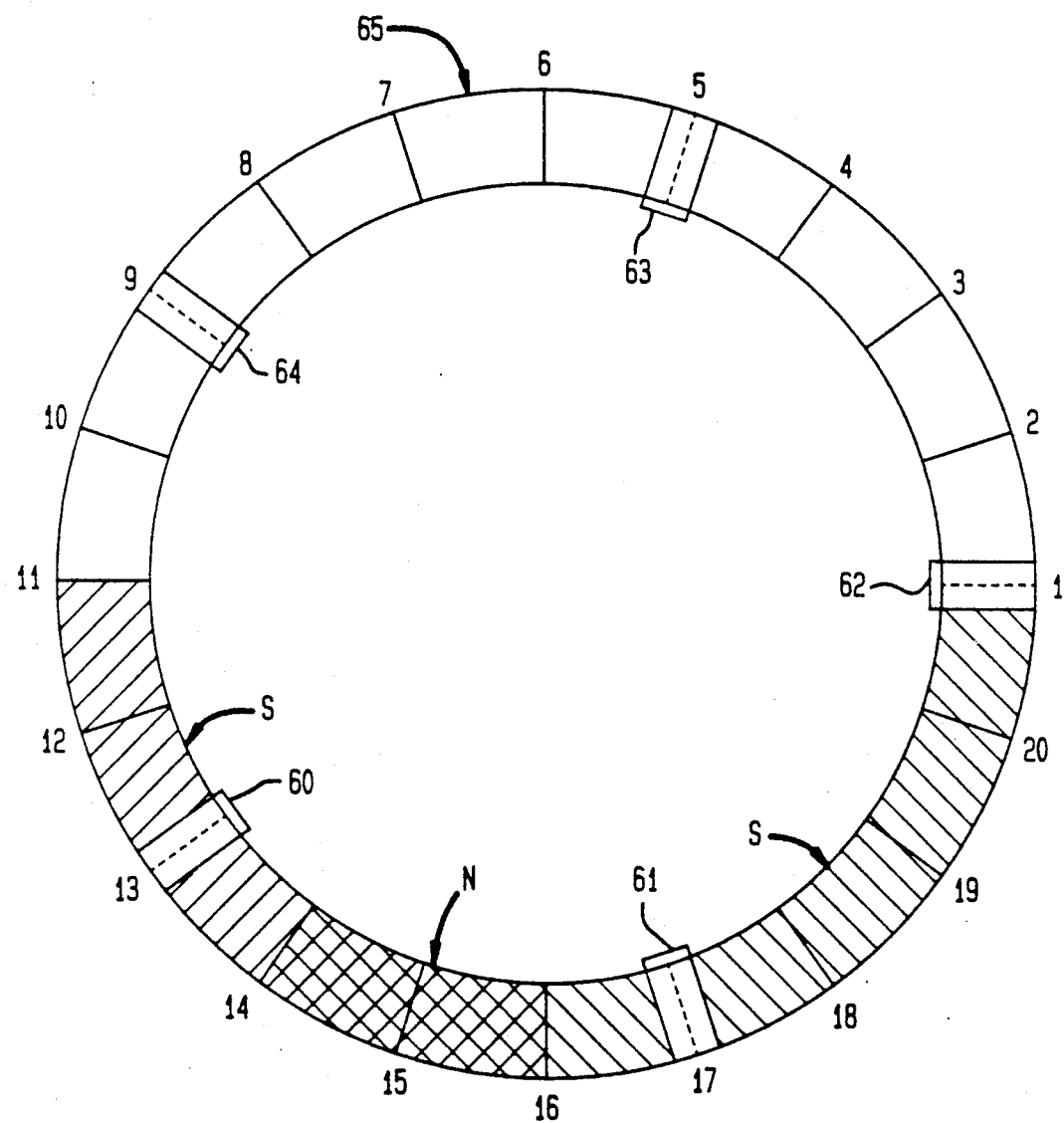
FIG. 6 shows still a fourth embodiment of the invention using magnets.
Figure 11:
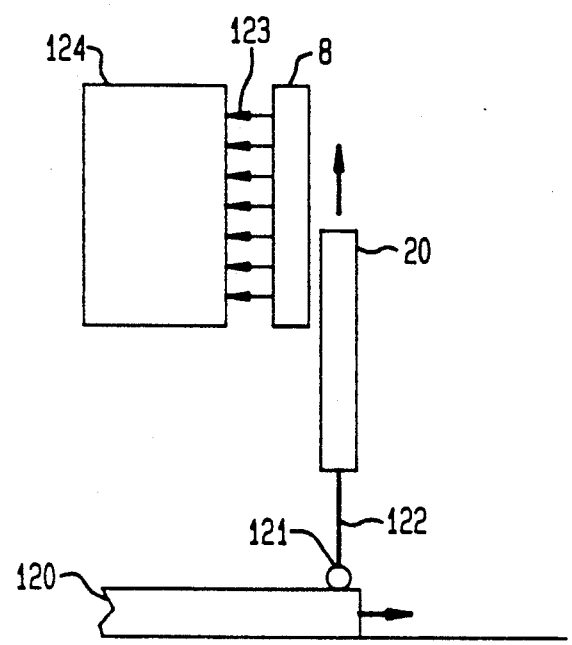
FIG. 11 is a block diagram showing the sensor of FIG. 1 used to measure the height of a moving object.
Figure 12:
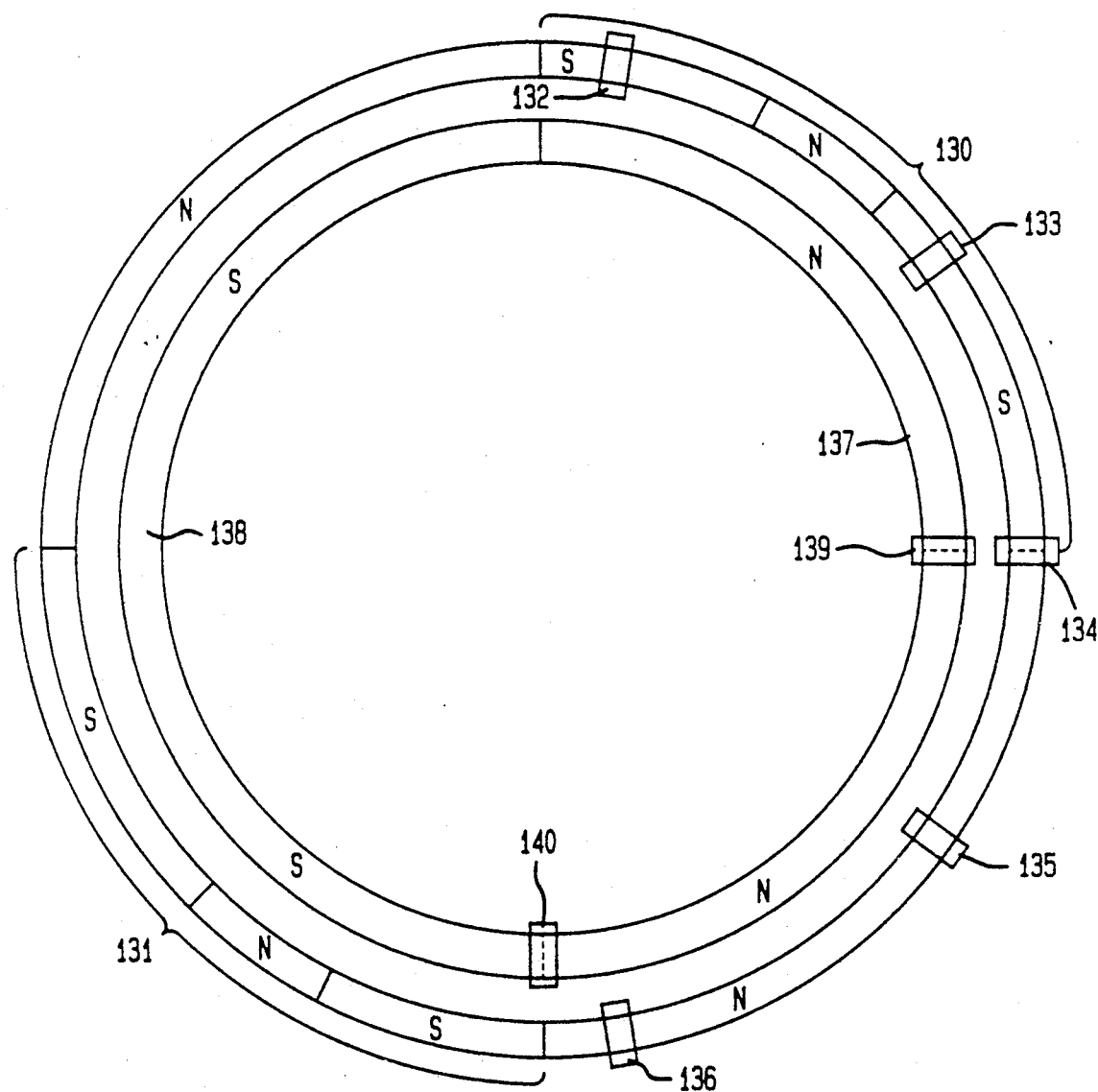
FIG. 12 shows still a fifth embodiment of the invention using two magnetic tracks.

The invention is not limited to linear geometries. FIGS. 6 and 12 show circular geometries for measuring rotation angles. The FIG. 6 embodiment employs five detectors 60-64. The magnet 65 is formed in the shape of a circle as shown with the 5:2:3 ratio S-N-S, and will yield a circular pattern that repeats every 360 degrees.

The output code would be the absolute Gray code shown in FIG. 7. The 5:2:3 pattern can be repeated any number of times spaced apart by 10 increments of no active pole or N poles yielding a code that is not absolute for 360 degrees. The output code will be repeated once every 360 degrees for each repeat of the pattern. That is, outputs of the 20th to 39th positions will have the same sequence as the outputs from the 0th to 19th positions as shown in FIG. 13.

The detectors are spaced every 360/RD degrees where R is the number of pattern repeats and D is the number of detectors. The detectors will be spaced $360/1 \times 5 = 72$ degrees if there is one pattern and five detectors; if there are two patterns in 360 degrees the detectors will be spaced $360/2 \times 5 = 36$ degrees apart. The total number of repeats possible depends on the diameter of the circle and the minimum detectable pole size.

The output can be converted to an absolute code by placing a second pattern parallel and connected to the first as shown in FIG. 12 consisting of one assembly with an outer and inner magnetic track and seven detectors. The outer track consists of two 5:2:3 pattern repeats 130 and 131 with five detectors 132-136 that are spaced 36 degrees apart opposite the outer track. The inner track consists of on (R)north 137 and one south pole 138 each of 180 degrees aligned to the outer track and two detectors 139 and 140 that would be used to identify the absolute value of the code as shown in the table of FIG. 13. Thus, when the Hex output from the five detectors 132-136 begins to repeat, the output from the two detectors 139, 140 will change providing absolute determination. The dual track embodiment could also be used with a linear magnet, and the lower resolution/inner track could also use the 5:2:3 pattern of poles.

In both of the circular geometry embodiments of FIGS. 6 and 12, the detectors would be fixed in the positions shown, and the magnetic pattern would rotate. The angular rotation would be indicated by the detector outputs indicated, for example, in FIG. 13 which can thus measure 40 positions, or over the 360°, $360/40 = 9°$ rotation per position. In FIG. 6, the S poles are single hatched, the N pole double hatched, and the 20 positions shown by the numbers 1-20 on the outside.

The preferred embodiment employs the Hall-Effect detectors and magnetic actuators because they are readily available at low cost, require little maintenance, and detecting magnetic fields provides a sturdy sensor that can operate in dirty environments. But the principles of the invention are also applicable to other kinds of detectors that can respond to a magnetic field, as well as to any kind of sensor comprised of radiation or field generating parts and an array of detectors capable of responding in a binary manner to the presence or absence of the radiation or field, which of course includes the possibilities of built-in thresholds; that is to say, radiation above and below a threshold respectively actuates and de-actuates the detector.

Thus, for example, the radiation generators can be LED's or any light source, and the detectors photodetectors.

FIG. 8 depicts an arrangement similar to FIG. 1 with an array of photo-detectors 70-76 and an actuator built up of assembled LED's 77, 78 and spacers 79, which LED's are always ON indicated by the vertical arrows. Partitions 80 between the ON LED's avoid light spilling over to actuate adjacent detectors.

FIG. 9 depicts an alternative in which a single or multiple light source 82, always ON, stretches the full length of the photo-detector array 83-39. In this case, with a fixed array, and with a fixed light source 82, the movable member is a mask 90 with holes or slots 91, 92 corresponding to the positions of magnet segments 22 and 24. These holes or slots 91, 92 allow light through to the detectors in the same way that the moving segments 22, 24 interact with the Hall-Effect detectors in FIG. 1.

FIG. 10 shows still a further alternative wherein radiation sources (LED's) 92 are each combined with its own photodetector 93. Such components are readily commercially available, and commonly used to detect the presence of a reflecting medium above the unit. When a reflector is present, the light 94 from the LED 92 will bounce off the reflector and be detected by the adjacent photo-detector, typically a silicon photodetector. For application to the invention, a mask 101 would be provided located above the array and representing the movable part of the sensor. The mask 101 would be reflective and provided with holes or slots that prevent reflected radiation, or be non-reflective and be provided with reflecting spots or areas where reflection is desired. Choosing the latter alternative, the first three optical units 95-97, corresponding to detectors 10-12 of FIG. 1, are shown under reflectors 99, 100 in positions corresponding to the S-N-S pole segment pattern in FIG. 1. The electrical behavior would be the same.

While the embodiments depicted all used an active actuator pattern in the ratio of 5:2:3, though highly desirable, this is not essential. It turns out that other actuator patterns can be devised following the principles of the invention, but they are less desirable for mechanical reasons within the current state of the art. For example, for the encoded output to be absolute and a Gray code, the magnet must move one divided by a power of two distance where the detectors are spaced a distance equal to the same power of 2; the available possibilities are $2^1$, $2^2$ which is included in the examples given, $2^3$, $2^4$, etc. $2^1$ can't be used because it will not produce an output with increased position resolution as the single detector could only be on or off and would give a position resolution of ½ detector spacing not ¼.

$2^3$, $2^4$ result in no improvement in detector spacing resolution because it would still take three ($2^3$) or four ($2^4$) detectors to distinguish the 8 or 16 bit patterns that result giving no improvement in performance but increasing magnet complexity. The choice of $2^2$ turns out to be the most practical producing a sturdy sensor with remarkable resolution, and very reliable performance.

As mentioned, the sensor can be used in any application wherein the detector array o the actuator is physically moved in the course of making a measurement. For example, FIG. 1 depicts a simple application for accurately measuring height of any object using the FIG. 1 embodiment. In this case, the object 120 moves in the direction shown by the arrow beneath a roller 121. The roller 121 is displaced upward until it rests on top of the object 120. The roller 121 is mechanically linked 122 to the magnet 20 of FIG. 1, as shown, and moves the magnet 20 an equal or proportionate distance upward. The seven outputs 123 from the detector array 8 is sent to a conventional signal processor 124. The processing circuitry is easily designed as is well known in this art not to accept outputs from the detector array until after the roller 121 has settled on top of the moving object. At that point, the array 8 is polled and a 7-bit output is generated that unambiguously indicates the precise subrange of values within which the object height falls. Any height that falls at a subrange boundary will cause an error no worse than the next subrange location. For the dimensions given for the example of FIG. 1, this means an error no worse than 0.05 inch. The processor 124 can either display the height measurement or use the information in some other manner, for example, for sorting the objects according to height.

In the example given, there is a 1:1 proportional relationship between the upward movement of the roller 121 and that of the magnet 20. This is not necessary. The linkage 122 can be changed so that the magnet 20 moves upward a multiple or submultiple of the roller movements in order to enhance the accuracy or increase the total range of measurement. Also, as mentioned, the geometry is not limited to straight line geometries. For example, the array of detectors can be arranged along the arc of a circle as shown, bent into a full circle, or oriented to follow any curve. The only restraint is that the actuator must have a similar shape or at least be able to actuate the detectors in a sequence as described herein. As previously mentioned, either the detector array or the actuator can be made movable. It is preferred to move the actuator because the active part of it will typically be shorter than that of the array. Moreover, when magnets are the actuator, they can take more abuse than the Hall-Effect detectors, which are more sensitive and typically include integrated circuits.

It is understood that, in the embodiments disclosed, all the detectors in the array are continuously energized with the appropriate voltages and currents so that they all remain in a continuous activated or on condition ready to output a "1" or "0" depending upon the polarity of the sensed magnetic field. In other words, the sensor output is in parallel. However, though the outputs at each detector all appear simultaneously, they can be polled and converted if desired into a serial stream that can be transmitted to a remote location if desired by conventional data communications equipment.

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set forth above as such variations and modifications are intended to be included within the scope of the appended claims.

What is claimed is:

1. A combination for determining the relative positions between a first and second object, comprising:
   said first object having fixably mounted thereto an array of detectors along a defined detector array pattern, each of said detectors being constructed to output a logic unit "1" or "0" such that said output of said array of detectors produces a binary output;
   said second object being displaceable relative to said first object and having a generating portion aligned with said detector array pattern such that displacement of said second object causes said generating portion to displace correspondingly along said detector array pattern;
   said generating portion having generating means for causing said binary output of said array of detectors to change in a gray encoded manner with respect to successive changes in position of said generating portion of said second object; and,
   said detectors being Hall-Effect devices responsive to a magnetic field, and the generating means being a magnet divided up into plural North and South poles, wherein the detector array is fixed with equal center-to-center spacings, and the magnetic poles of said magnet have non-equal center-to-center spacings.

2. A combination as claimed in claim 1, wherein said generating means further includes means for causing said binary output of said array of detector to change in a absolute gray encoded manner.

3. A combination as claimed in claim 1, wherein the detectors are aligned in a straight line.

4. A combination as claimed in claim 1, wherein the detectors are aligned in a straight line pattern.

5. A combination as claimed in claim 4, wherein the center-to-center spacing of adjacent detectors is one-quarter of the desired sensing resolution, and the magnet comprises at least a first segment having a North or South pole, a second segment, and a third segment having a North or South pole, the length of the first, second and third segments in the given line direction being in the ratio of 5:2:3.

6. A combination as claimed in claim 5, wherein the first and third segments have the same magnetic pole, and the second segment has the opposite magnetic pole.

* * * * *